United States Patent
Kim

(10) Patent No.: US 8,459,832 B2
(45) Date of Patent: Jun. 11, 2013

(54) LIGHT EMITTING DEVICE AND SYSTEM PROVIDING WHITE LIGHT WITH VARIOUS COLOR TEMPERATURES

(75) Inventor: Yu-Sik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/562,888

(22) Filed: Jul. 31, 2012

(65) Prior Publication Data

US 2012/0293093 A1    Nov. 22, 2012

Related U.S. Application Data

(63) Continuation of application No. 12/584,513, filed on Sep. 8, 2008, now Pat. No. 8,297,783.

(30) Foreign Application Priority Data

Sep. 10, 2008 (KR) .......................... 10-2008-0089439

(51) Int. Cl.
 *F21V 9/00*   (2006.01)

(52) U.S. Cl.
 USPC ...... 362/231; 362/230; 362/311.01; 362/800; 257/79; 361/600

(58) Field of Classification Search
 USPC .............. 362/800, 84, 230, 231, 293, 2, 510, 362/166, 260, 310, 296.02, 254, 255, 256, 362/311.01, 311.02, 1, 51, 165; 257/79–103; 361/600–837
 See application file for complete search history.

(56) References Cited

U.S. PATENT DOCUMENTS

| | | | |
|---|---|---|---|
| 7,126,162 B2 * | 10/2006 | Reeh et al. | 257/98 |
| 2002/0084749 A1 * | 7/2002 | Ayala et al. | 313/512 |
| 2004/0012027 A1 * | 1/2004 | Keller et al. | 257/79 |
| 2006/0114201 A1 | 6/2006 | Chang | |
| 2008/0048193 A1 * | 2/2008 | Yoo et al. | 257/89 |
| 2010/0061078 A1 | 3/2010 | Kim | |

FOREIGN PATENT DOCUMENTS

| | | |
|---|---|---|
| KR | 10-2004-0049221 | 6/2004 |
| KR | 10-2008-0002266 | 1/2008 |

OTHER PUBLICATIONS

"Light Emitting Device and System Providing White Light With Various Color Temperatures" Specification, Drawings, Claims and Prosecution History, of U.S. Appl. No. 12/584,513, filed Sep. 8, 2009, by Yu-Sik Kim.

* cited by examiner

*Primary Examiner* — Evan Dzierzynski
*Assistant Examiner* — Danielle Allen
(74) *Attorney, Agent, or Firm* — Onello & Mello, LLP

(57) ABSTRACT

In a light emitting device and system providing white light with various color temperatures are provided, a light emitting device includes a light emitting element (LED) that is operated by a driving bias and emits first light, and a phosphor layer including a phosphor that partially wavelength-converts first light and emits second light, thereby emitting white light using the first light and the second light, wherein the phosphor has a maximum conversion efficiency at a first level of the driving bias, and the LED has a maximum conversion efficiency at a second level of the driving bias, the first level being different from the first level.

9 Claims, 11 Drawing Sheets

LIGHT EMITTING DEVICE AND SYSTEM PROVIDING WHITE LIGHT WITH VARIOUS COLOR TEMPERATURES

CROSS-REFERENCE TO RELATED APPLICATION

This application is a continuation application of U.S. patent application Ser. No. 12/584,513, filed on Sep. 8, 2008, now U.S. Pat. No. 8,297,783, which claims priority from Korean Patent Application No. 10-2008-0089439 filed on Sep. 10, 2008 in the Korean Intellectual Property Office, the entire contents of which is incorporated herein by reference.

BACKGROUND

1. Field of the Invention

Embodiments of the present invention relate to a light emitting device and system providing white light with various color temperatures.

2. Description of the Related Art

Light emitting elements, such as light emitting diodes (LEDs), emit light as a result of the induced recombination of electrons and holes. LEDs consume a reduced amount of power and enjoy relatively long lifespan as compared to conventional incandescent light bulbs or other light sources. Additionally, LEDs can be highly integrated and can be placed in a narrow spaces. Further, LEDs are resistant to vibration.

A light emitting device is capable of generating light of various wavelengths according to the manner in which it is manufactured. For example, light emitting devices can be configured to generate blue light, ultraviolet (UV) light, white light, or the like.

An example method of manufacturing a white light emitting device capable of generating white light will now be described. That is to say, a white light emitting device capable of generating bluish white light can be manufactured by coating a yellow phosphor material on a bluish light emitting element (LED) that emits blue light. Alternatively, the white light emitting device capable of generating reddish white light can be manufactured by coating a yellow phosphor material and red phosphor material on the bluish LED.

The above-example white light emitting devices, however, are commonly developed to be configured using a phosphor coating technique that maximizes luminescence efficiency at a fixed color temperature, that is, a temperature of bluish white or reddish white. As a result, a device that outputs white light with various color temperatures cannot be implemented using a single white light emitting device.

SUMMARY

Embodiments of the present specification provide a light emitting device capable of providing white light with various color temperatures.

Embodiments of the present specification also provide a light emitting system capable of providing white light with various color temperatures.

The above and other objects will be described in or be apparent from the following description of the preferred embodiments.

According to an aspect, there is provided a light emitting device including a light emitting element (LED) that is operated by a driving bias and emits first light, and a phosphor layer including a phosphor that partially wavelength-converts first light and emits second light, thereby emitting white light using the first light and the second light, wherein the phosphor has a maximum conversion efficiency at a first level of the driving bias, and the LED has a maximum conversion efficiency at a second level of the driving bias, the first level being different from the first level.

Here, the color temperature of the white light can be varied by adjusting the level of the driving bias. In detail, the second light can have a dominant wavelength at the first level of the driving bias in the white light, and the first light can have a dominant wavelength at the second level of the driving bias in the white light.

In an exemplary embodiment, the LED may be a blue LED that emits blue light, and the phosphor may include a red phosphor that partially wavelength-converts the blue light and emits red light, a yellow phosphor that partially wavelength-converts the blue light and emits yellow light, or a green phosphor that partially wavelength-converts the blue light and emits green light. In this case, reddish white light is generated at the first level of the driving bias, and bluish white light is generated at the second level of the driving bias.

In another exemplary embodiment, the LED may be a UV LED that emits a UV light, the phosphor may include a red phosphor that partially wavelength-converts the UV light and emits red light, a green phosphor that partially wavelength-converts the UV light and emits green light, and a blue phosphor that partially wavelength-converts the UV light and emits blue light. Here, the blue phosphor has the maximum conversion efficiency at the second level of the driving bias.

According to another aspect, there is provided a light emitting device comprising a light emitting element (LED) that is operated by a driving bias and emits first light, a first phosphor that partially wavelength-converts the first light and emits second light, and second phosphor that partially wavelength-converts the first light and emits third light, thereby emitting white light using the first light, the second light and the third light, wherein the first phosphor has a maximum conversion efficiency at a first level of the driving bias, and the second phosphor has a maximum conversion efficiency at a second level of the driving bias, the first level being different from the first level.

Here, the color temperature of the white light may be varied by adjusting the level of the driving bias. In detail, the second light has a dominant wavelength at the first level of the driving bias in the white light, and the third light has a dominant wavelength at the second level of the driving bias in the white light.

In an exemplary embodiment, the LED may be a UV LED that emits a UV light, the first phosphor may include a red phosphor that partially wavelength-converts the blue light and emits red light, and the second phosphor is a blue phosphor that partially wavelength-converts the UV light and emits blue light.

According to still another aspect, there is provided a light emitting device comprising a blue light emitting element (LED) that is operated by a driving bias and emits blue light, and a red phosphor that partially wavelength-converts the blue light and emits red light, thereby emitting white light using the blue light and the red light, wherein reddish white light or bluish white light is generated by adjusting the level of the driving bias.

Here, reddish white light may be generated at a first level of the driving bias, and bluish white light may be generated at a second level of the driving bias, the first level being different from the first level. The second level is preferably higher than the first level.

In addition, the red phosphor may have a maximum conversion efficiency at the first level of the driving bias, and the blue phosphor may have a maximum conversion efficiency at the second level of the driving bias.

The light emitting device may further include a yellow phosphor that partially wavelength-converts the blue light and emits yellow light, or a green phosphor that partially wavelength-converts the blue light and emits green light.

Here, the driving bias can be DC power.

According to a further aspect, there is provided a light emitting system including the light emitting device and a sensor that senses user's body temperature, wherein the level of the driving bias is controlled by the sensor.

According to still further aspect, there is provided a light emitting system comprising the light emitting device.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
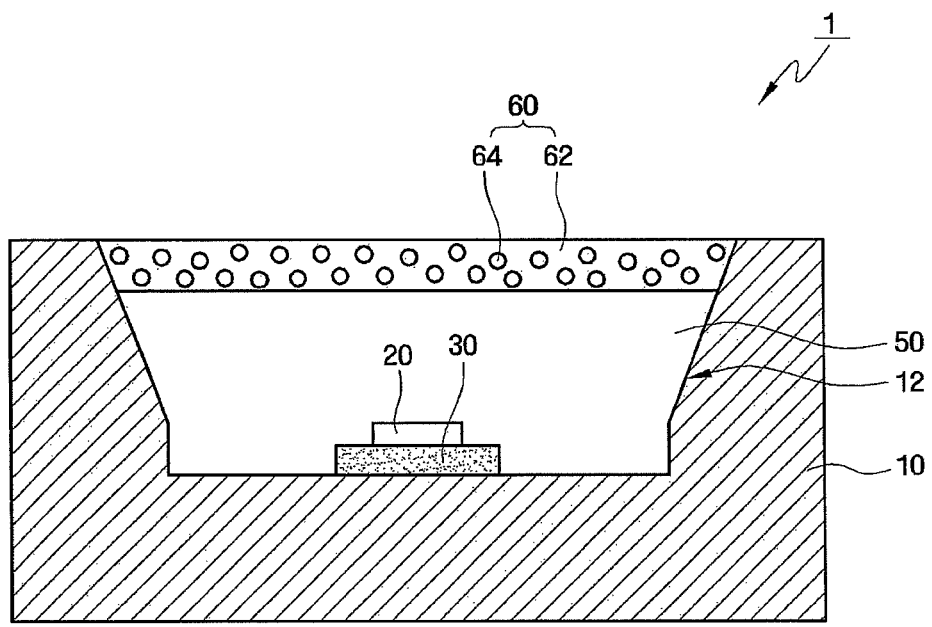
FIG. 1 is a cross-sectional view of a light emitting device according to a first embodiment of the present invention.
Figure 7:
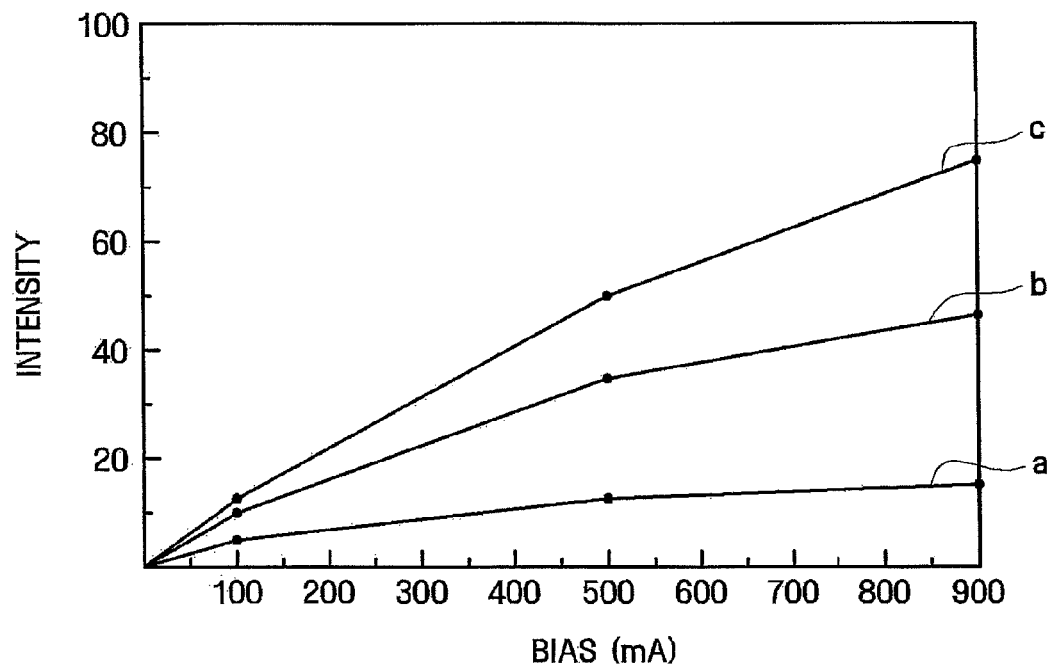
FIG. 7 is a diagram illustrating effects of light emitting devices according to embodiments of the present invention.

FIG. 1 is a cross-sectional view of a light emitting device according to a first embodiment of the present invention, in which only main parts are simplified or exaggerated and shown. FIG. 2, and FIGS. 3A through 3C are detailed diagrams illustrating exemplary connection between a package body and an emitter. FIG. 7 is a diagram illustrating effects of light emitting devices according to embodiments of the present invention.

Referring first to FIG. 1, a light emitting device 1 according to a first embodiment includes a package body 10, a light emitting diode (LED) 20, a submount 30, a transparent resin layer 50, and a phosphor layer 60.

The LED 20 may be disposed on the package body 10. In detail, the package body 10 may incorporate a slot 12, and the LED 20 may be disposed within the slot 12 or may be otherwise connected to the slot 12. In particular, the slot 12 may have sloping sidewalls. Light generated from the LED 20 may be reflected at the sidewalls to then travel outward direction.

While FIG. 1 illustrates that the LED 20 is connected to the submount 30 and the LED 20 connected to the submount 30 is disposed in the slot 12 of the package body 10, the connection relationship is not limited to the illustrated example. For example, the LED 20 may be directly mounted on the package body 10 without using the submount 30.

Meanwhile, the package body 10 and the LED 20 may be connected to each other in various manners. For example, the package body 10 and the LED 20 may be connected to each other in such manners as shown and described below in connection with FIGS. 2 and 3A through 3C, and in other ways.

Figure 2:
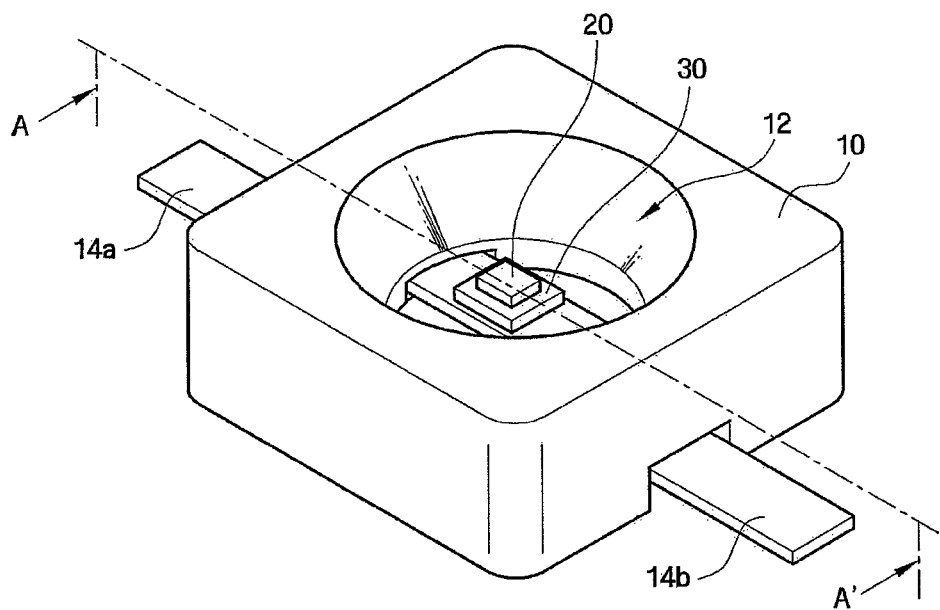
FIG. 2, and FIGS. 3A through 3C are detailed diagrams illustrating exemplary connection between a package body and an emitter.
Figure 3A:
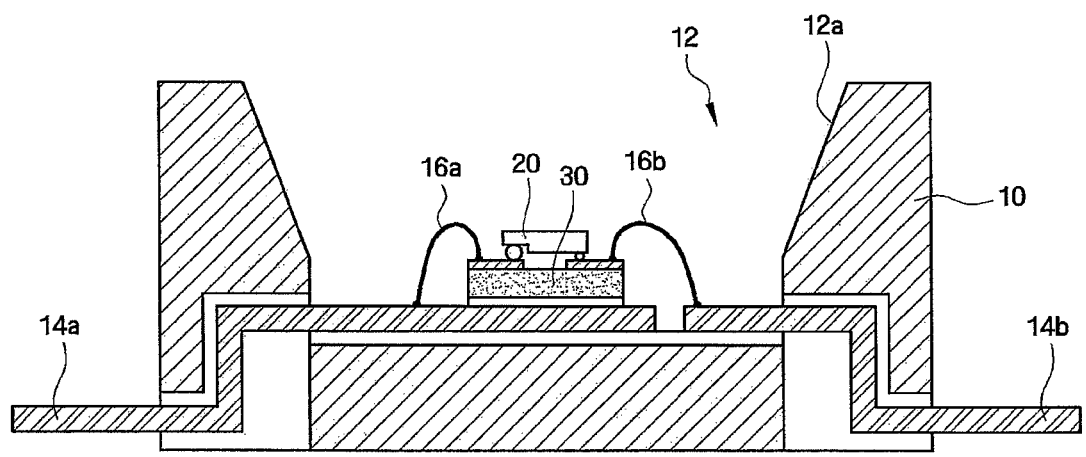

Referring to FIGS. 2 and 3A, the LED 20 may be an LED (Light Emitting Diode), and may be mounted on the submount 30. The LED 20 can include a first conductive layer of a first conductivity type (e.g., n type), a second conductive layer of a second conductivity type (e.g., p type), a light emitting layer disposed between the first conductive layer and the second conductive layer, a first electrode connected to the first conductive layer, and a second electrode connected to the second conductive layer. When a forward driving bias is applied to the LED 20, light is generated by recombination of carriers (i.e., electrons) of the first conductive layer and carriers (i.e., holes) of the second conductive layer in the light emitting layer. The first conductive layer, the second conductive layer, and the light emitting layer of the LED can be represented by the following Chemical Formula $In_xAl_yGa_{(1-x-y)}N$ ($0 \leq x \leq 1$, $0 \leq y \leq 1$).

The LED 20 may be operated by applying a driving bias between the first electrode and the second electrode. The driving bias corresponds to the absolute value of a difference between a first bias applied to the first electrode and a second bias applied to the second electrode. Here, the driving bias may be DC power.

Meanwhile, the LED 20 of a flip chip type LED is illustrated by way of example, but the present invention is not limited thereto. For example, the LED 20 may be a lateral type LED or a vertical type LED. In the flip chip type LED, a first electrode and a second electrode are oriented in a downward direction. In the lateral type LED, a first electrode and a second electrode are oriented in an upward direction. In the vertical type LED, one of first and second electrodes is oriented in an upward direction, while the other of the first and second electrodes is oriented in a downward direction.

In addition, while the LED 20 of a top view type is illustrated in FIG. 2, meaning that light is outwardly emitted from a top of the device, embodiments of the present invention are not limited thereto. For example, the LED 20 may be of a side view type. In a case where the LED 20 is of a top view type, it can generally be square in shape having a size of at least 1 mm×1 mm. In addition, the top view type LED 20 radiates light directly on an object, and is typically used for a lighting device, a display device, and so on. By comparison, a side view type LED is generally rectangular in shape, having a size of at least 70 μm×300 μm, (e.g., 150 μm×400 μm), and is variable in size according to the kind of device applied. The side view type LED is usually used for mobile equipment, such as a mobile phone, an MP3 player, a navigation device, etc., a display device, or the like. The top view type LED and the side view type LED are substantially the same in terms of their configurations and operations, except for their respective sizes and shapes.

In other embodiments, the LED 20 may be a blue LED 20 that emits blue light, that is, light of a blue emission wavelength, or, in other embodiments, a UV LED 20 that emits UV light.

The LED 20 is disposed within the slot 12 of the package body 10. The slot 12 is larger than the LED 20. The size of the slot 12 may be determined in consideration of the extent in which the light generated from the LED 20 is reflected at sidewalls 12a of the slot 12, the angle of reflection, the type of transparent resin layer 50 filling the slot 12, or the type of phosphor layer 60. The LED 20 is preferably placed at a middle region of the slot 12. When distances between the LED 20 and each of the sidewalls 12a are substantially the same, nonuniformity in the chromaticity diagram can be avoided.

The package body 10 can be formed, for example, of an organic material having excellent light transmittance, such as a silicon resin, an epoxy resin, an acryl resin, a glass resin, a fluorine resin, or an imide resin, or an inorganic material having excellent light transmittance, such as glass, or silica gel. In order to prevent a resin material from becoming melted due to heat generated during manufacturing, a thermally reinforced resin can be used. In order to alleviate inherent thermal stress in a resin, a variety of fillers including aluminum nitride, aluminum oxide, and composite materials thereof may also be added. However, materials of the package body 10 are not limited to resin materials. For example, the package body 10 may be formed of a metallic or ceramic material in part (e.g., the sidewalls 12a), or entirely. If the package body 10 is entirely formed of, for example, a metallic material, the heat generated from the LED 20 is easily transferred externally.

FIG. 3A shows a case in which the package body 10 is entirely formed of a metallic material. As illustrated, the package body 10 further includes leads 14a and 14b electrically connected to the LED 20. The LED 20 is electrically connected to the submount 30, and the submount 30 is connected to the leads 14a and 14b through wires 16a and 16b. The leads 14a and 14b may be formed of a material having a highly thermally conductive material to allow the heat generated from the LED 20 to be externally transferred through the leads 14a and 14b.

Figure 3B:
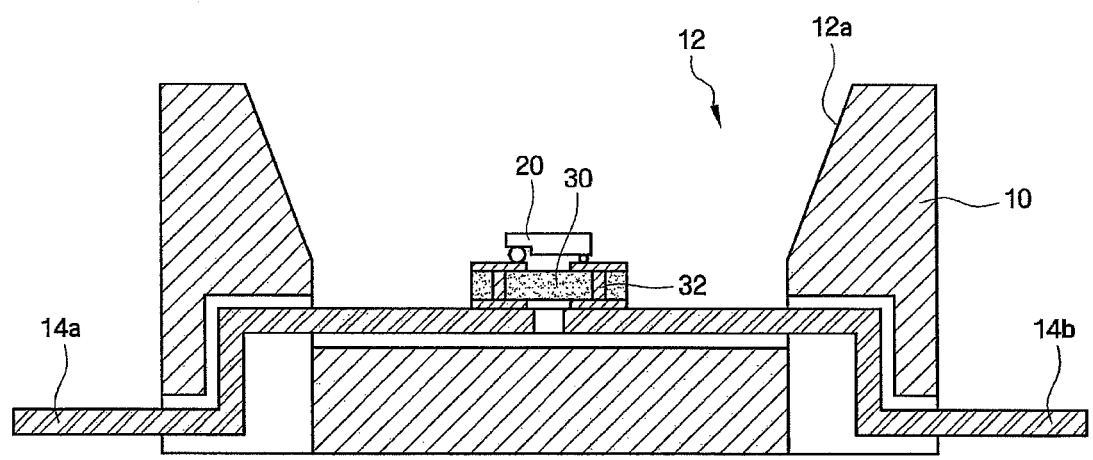
Figure 3C:
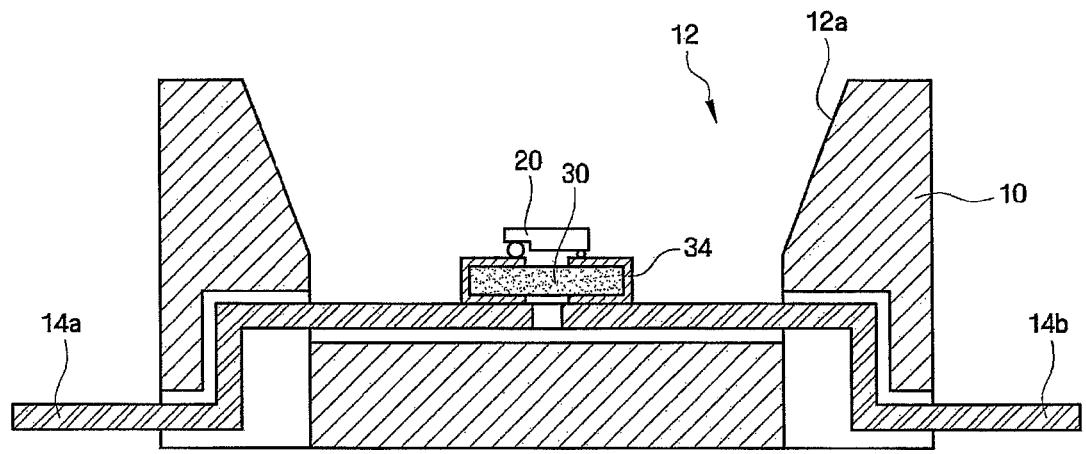

Meanwhile, the light emitting device shown in FIG. 3B is different from that shown in FIG. 3A in that the submount 30 is connected to the leads 14a and 14b through a conductive via 32 provided in the submount 30. The light emitting device shown in FIG. 3C is different from that shown in FIG. 3A in that the submount 30 is connected to the leads 14a and 14b through interconnections 34 provided on the top, lateral, and rear surfaces of the submount 30. The light emitting devices shown in FIGS. 3B and 3C can provide enhanced device integration, since wires are not employed.

As described above in connection with FIGS. 2 and 3A through 3C, embodiments of the present invention can be applied to various types of light emitting devices.

Referring back to FIG. 1, a transparent resin layer 50 may be coated on the LED 20. In detail, the transparent resin layer 50 may fill at least some of the slot 12. For example, as shown in FIG. 1, the transparent resin layer 50 does not completely fill the slot 12 but rather fills approximately 90% of the slot 12.

The transparent resin layer 50 can be formed of any material that can be used to fill the slot 12 of the package body 10, but is not particularly limited. Example materials of the transparent resin layer 50 that can be employed include resins, such as epoxy resin, silicon resin, hardened silicon resin, denatured silicon resin, urethane resin, ocetane resin, acryl resin, polycarbonate resin, polyimide resin, or the like.

The phosphor layer 60 can be formed on the transparent resin layer 50. In detail, the phosphor layer 60 can be a combination of a transparent resin 62 and a phosphor 64, but not limited thereto. That is to say, the phosphor layer 60 may include only the phosphor 64 material, without the transparent resin 62 material.

The phosphor 64 will now be described in more detail. The phosphor 64 is a material that absorbs the light emitted from the LED 20 and wavelength-converts the same into light of a different wavelength. That is to say, the phosphor 64 is a material, which absorbs light based on primary luminescence of the LED 20 and emits light by secondary luminescence.

The phosphor 64 allows the resulting light emitting device to render various colors. For example, rendering white light can be performed in the following manner. If the LED 20 emits blue light, i.e., light of a blue wavelength, which is referred to as a blue LED, the phosphor layer 60 partially wavelength-converts the blue light containing a yellow phosphor that emits yellow light, and a red phosphor that emits red light. Alternatively, the phosphor layer 60 may partially wavelength-convert to produce a green phosphor that emits green light. Further, the phosphor layer 60 may partially wavelength-convert to produce a red phosphor that emits red light. That is to say, in a case where the LED 20 is a blue LED, primary light emitted from the LED 20 and secondary light emitted from the phosphor are combined together to output a combined white light.

In a case where the LED 20 emits UV light of a UV wavelength, which is referred to as a UV LED, the phosphor layer 60 may include a red phosphor, a green phosphor, and a blue phosphor (i.e., RGB).

The phosphor 64 is preferably at least one selected from a nitride-/oxynitride-based phosphor, mainly activated by lanthanoids such as Eu and Ce; an alkaline earth halogen apatite phosphor, mainly activated by lanthanoids such as Eu or by transition metal elements such as Mn; an alkaline earth metal borate halogen phosphor; an alkaline earth metal aluminate phosphor; an alkaline earth sulfide phosphor; a rare earth aluminate phosphor, mainly activated by lanthanoids such as Ce; an alkaline earth silicate phosphor; an alkaline earth thiogallate phosphor, an alkaline earth silicon nitride phosphor; a germinate phosphor; and an organic and an organic complexes, mainly activated by lanthanoids such as Eu. As specific examples, the phosphors shown below can be used but it is not limited thereto.

Examples of the nitride-based phosphor that is mainly activated with lanthanoid elements such as Eu and Ce include $M_2Si_5N_8$:Eu, $M_2Si_5N_8$:Eu, $MSi_7N_{10}$:Eu, $M_{1.8}Si_5O_{0.2}N_8$:Eu, $M_{0.9}Si_7O_9$:Eu (wherein M represents at least one element selected from among Sr, Ca, Ba, Mg and Zn).

Examples of the oxynitride phosphor that is mainly activated with lanthanoid elements such as Eu and Ce include $MSi_2O_2N_2$:Eu (wherein M represents at least one element selected from among Sr, Ca, Ba, Mg and Zn).

Examples of the alkaline earth halogen apatite phosphor that is mainly activated with lanthanoid elements such as Eu, or with transition metal elements such as Mn include $M_5(PO_4)_3X$:R (wherein M represents at least one element selected from among Sr, Ca, Ba, Mg and Zn, X represents at least one element selected from among F, Cl, Br, and I, and R represents Eu or Mn, or Eu and Mn.

Examples of the alkaline earth metal borate halogen phosphor include $M_2B_5O_9X$:R (wherein M represents at least one element selected from among Sr, Ca, Ba, Mg and Zn, X represents at least one element selected from among F, Cl, Br, and I, and R represents Eu or Mn, or Eu and Mn).

Examples of the alkaline earth metal aluminate phosphor include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R (R represents Eu or Mn, or Eu and Mn).

Examples of the alkaline earth sulfide phosphor include $La_2O_2S$:Eu, $Y_2O_2S$:Eu, $Gd_2O_2S$:Eu.

Examples of the rare earth aluminate phosphor that is mainly activated with lanthanoid elements such as Ce include YAG-based phosphors represented by the formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. Examples of the rare earth aluminate phosphor also include $Tb_3Al_5O_{12}$:Ce, $Lu_3Al_5O_{12}$:Ce in which portion or all of Y is substituted with Tb or Lu.

Examples of the alkaline earth silicate phosphor include silicates such as $(SrBa)_2SiO_4$:Eu.

Examples of other phosphors include ZnS:Eu, $Zn_2GeO_4$:Mn, $MGa_2S_4$:Eu (wherein M represents at least one element selected from among Sr, Ca, Ba, Mg and Zn, and X represents at least one element selected from among F, Cl, Br and I).

If necessary, the phosphors described above can contain at least one element selected from among Tb, Cu, Ag, Au, Cr, Nd, Dy, Co, Ni and Ti, in place of Eu, or in addition to Eu.

It is possible to use a phosphor which is other than the phosphor described above and has the same performance and effect as those of the phosphors.

The light emitting device 1 according to the first embodiment of the present invention can operate as follows. In the following description, the operation of the light emitting device 1 will be described with reference to FIG. 3A. Embodiments of the present invention can equally be applied to other types of light emitting devices, such as those shown in FIGS. 3B and 3C.

Referring to FIGS. 1 and 3A, when a first bias (e.g., V−, I−, or ground) is externally applied to the lead 14a, the first bias is transmitted to the first electrode of the LED 20 through the wire 16a and the submount 30. When a second bias (e.g., V+ or I+) is externally applied to the lead 14b, the second bias is transmitted to the second electrode of the LED 20 through the wire 16b and the submount 30. That is to say, a driving bias corresponding to the absolute value of a difference between the DC power and the second bias is applied to the LED 20. Then, the driving bias actuates the LED 20 to generate light. In a case where the LED 20 is a blue LED, blue light is generated. In a case where the LED 20 is a UV LED, UV light is generated.

The light generated from the LED 20 is partially wavelength-converted by the phosphor material in the phosphor layer 60. For example, the yellow phosphor is converted into yellow light, the green phosphor is converted into green light, and the red phosphor is converted into red light.

The light generated from the LED 20 and the light that is wavelength-converted in the phosphor layer 60 are mixed and output together. In such a manner, the light emitting device 1 emits white light.

The light emitting device 1 according to the first embodiment of the present invention can vary color temperatures of white light by adjusting the level of the driving bias.

First, when the driving bias is at a first level, the white light that is generated may be reddish white light, and when the driving bias is at a second level that is different from the first level, the white light may be bluish white light. Here, the second level may be higher than the first level. In other embodiments, the second level may be lower than the first level.

Referring to FIG. 7, the x axis indicates the driving bias, and the y axis indicates the standardized intensity of the emitted light. FIG. 7 shows that standardized intensities of red light, green light, and blue light according to varying driving biases in cases where a UV LED is used as the LED 20, a red phosphor is used as the phosphor in the phosphor layer 60, and a green phosphor and a blue phosphor are used. In FIG. 7, reference symbol 'a' indicates the red light, 'b' indicates the green light, and 'c' indicates the blue light, respectively.

In plot 'a' corresponding to red light, the intensity of red light is nearly saturated even when the driving bias is not so high (e.g., 500 mA). That is to say, there is no significant intensity difference in the intensity of the generated red light at driving biases between about 500 mA and 900 mA. In detail, when the driving bias is 500 mA, the red phosphor can be said to have a maximum conversion efficiency. The maximum conversion efficiency refers to the extent in which each phosphor receives light from a LED and maximally converts the received light. For example, assuming that the light quantity of approximately 100 is generated from a LED and the phosphor is capable of maximally converting the light quantity of approximately 30, the maximum conversion efficiency is 30%. The maximum conversion efficiency is a driving level at which the intensity does not increase any further.

On the other hand, in plot 'c' corresponding to blue light, there is a significant intensity difference between driving biases 500 mA and 900 mA. That is to say, the intensity of blue light is not saturated until the driving bias is 900 mA or higher. If the intensity of blue light is saturated at the driving bias of 900 mA, the blue phosphor has the maximum conversion efficiency at a value of the driving bias of 900 mA.

It can be understood from FIG. 7 that each respective phosphor material has a maximum conversion efficiency at a specific driving bias. In other words, the driving bias level at which the red phosphor, i.e. plot 'a', demonstrates the maximum conversion efficiency may be different from the driving bias level at which the blue phosphor, i.e. plot 'c', demonstrates the maximum conversion efficiency.

Referring back to FIGS. 1 and 3A, the configuration of the light emitting device 1 according to the first embodiment of the present invention will now be described in consideration of the aforementioned operational characteristics.

The light emitting device 1 includes the LED 20 that is operated by a driving bias and emits first light, and the phosphor layer 60 including the phosphor 64 that partially wavelength-converts the first light and emits second light. Thus, the light emitting device 1 emits white light using the first light and the second light. The phosphor 64 has the maximum conversion efficiency at a first level of the driving bias. The LED 20 has the maximum conversion efficiency at a second level of the driving bias, which is different from the first level.

In a first example, it is assumed that the LED 20 is a blue LED and the phosphor 64 is a red phosphor or a green phosphor (or a yellow phosphor).

For example, the blue LED may have the maximum conversion efficiency at approximately 900 mA, and the red phosphor may have the maximum conversion efficiency at approximately 500 mA.

Since the blue LED cannot maximize its luminescence efficiency at 500 mA, blue light is not emitted to the maximum efficiency, while the red phosphor is capable of converting the emitted blue light into red light to maximum efficiency. That is, red light is dominantly present in the white light that has the light emitted from the blue LED and the light emitted from the red phosphor mixed together. Thus, the resulting white light emitted from the light emitting device 1 is reddish white.

On the other hand, since the blue LED has the maximum luminescence efficiency at approximately 900 mA, it emits blue light to the maximum efficiency, and the red phosphor is capable of converting as much light as converted at 500 mA. That is, blue light is dominantly present in the white light having the light emitted from the blue LED and the light emitted from the red phosphor mixed together. Thus, the white light emitted from the light emitting device 1 is bluish white.

In a second example, it is assumed that the LED 20 is a UV LED and the phosphor 64 is a red phosphor, a blue phosphor, or a green phosphor (or a yellow phosphor).

For example, the UV LED may have the maximum conversion efficiency at approximately 900 mA, the red phosphor may have the maximum conversion efficiency at approximately 500 mA, and the blue phosphor may have the maximum conversion efficiency at approximately 900 mA, respectively.

Since the UV LED cannot maximize its luminescence efficiency at 500 mA, UV light is not emitted to the maximum, while the red phosphor is capable of converting the emitted UV light into red light to the maximum. In addition, the blue phosphor is capable of converting the emitted UV light into blue light, but not to the maximum. That is, red light is dominantly present in the white light having the light emitted from the blue LED and the light emitted from the red phosphor mixed together. Thus, the white light emitted from the light emitting device 1 is reddish white.

On the other hand, since the UV LED has the maximum luminescence efficiency at approximately 900 mA, it emits UV light to the maximum, and the red phosphor is capable of converting as much as converted at 500 mA. In addition, the blue phosphor is capable of converting as much as the emitted UV light as possible into blue light. That is, blue light is dominantly present in the white light having the light emitted from the red phosphor and the light emitted from the blue phosphor mixed together. Thus, the white light emitted from the light emitting device 1 is bluish white.

The light emitting device 1 according to the first embodiment of the present invention includes a LED that is operated by a driving bias and emits first light, a first phosphor that partially wavelength-converts the first light and emits second light, and a second phosphor that partially wavelength-converts the first light and emits third light, thereby emitting white light using the first light, the second light and the third light. The first phosphor has the maximum conversion efficiency at a first level of the driving bias, and the second phosphor has the maximum conversion efficiency at a second level of the driving bias, the first level being different from the first level.

Here, the LED may be a UV LED, the first phosphor may be a red phosphor, and a second phosphor may be a blue phosphor. In order to produce white light, the LED may further include a green phosphor (or a yellow phosphor).

It is assumed, in one example, that the UV LED has the maximum conversion efficiency at approximately 1000 mA, the red phosphor has the maximum conversion efficiency at approximately 500 mA, and the blue phosphor has the maximum conversion efficiency at approximately 900 mA. Then, white light emitted from the light emitting device 1 becomes reddish at 500 mA, and bluish at 900 mA.

As described above, the color temperature of the white light may be varied by adjusting the level of the driving bias. At the first level of the driving bias (approximately 500 mA in the above example), the second light (i.e., red light) is present more dominantly than the first light (i.e., blue light) in the white light, and the white light becomes reddish. In addition, at the second level of the driving bias (approximately 900 mA in the above example), the first light (i.e., blue light) is present more dominantly than the second light (i.e., red light) in the white light, and the white light becomes bluish.

When the LED 20 has the maximum luminescence efficiency at the second level, bluish white light is emitted from the light emitting device 1 at approximately maximum efficiency, but reddish white light is not emitted with the maximum efficiency. The light emitting device 1 according to the first embodiment of the present invention is advantageous in that it can generate bluish white light and reddish white light, even if there is a small reduction in luminescence efficiency. In other words, white light having various color temperatures can be generated from a single unit of the light emitting device 1.

FIGS. 4 through 6B are cross-sectional views of light emitting devices according to second through fifth embodiments of the present invention. The operating principles of the light emitting devices according to second through fifth embodiments of the present invention are substantially the same as those of the first embodiment of the present invention. That is to say, the light emitting devices according to second through fifth embodiments of the present invention can vary according to color temperatures of white light by adjusting the level of a driving bias.

Figure 4:
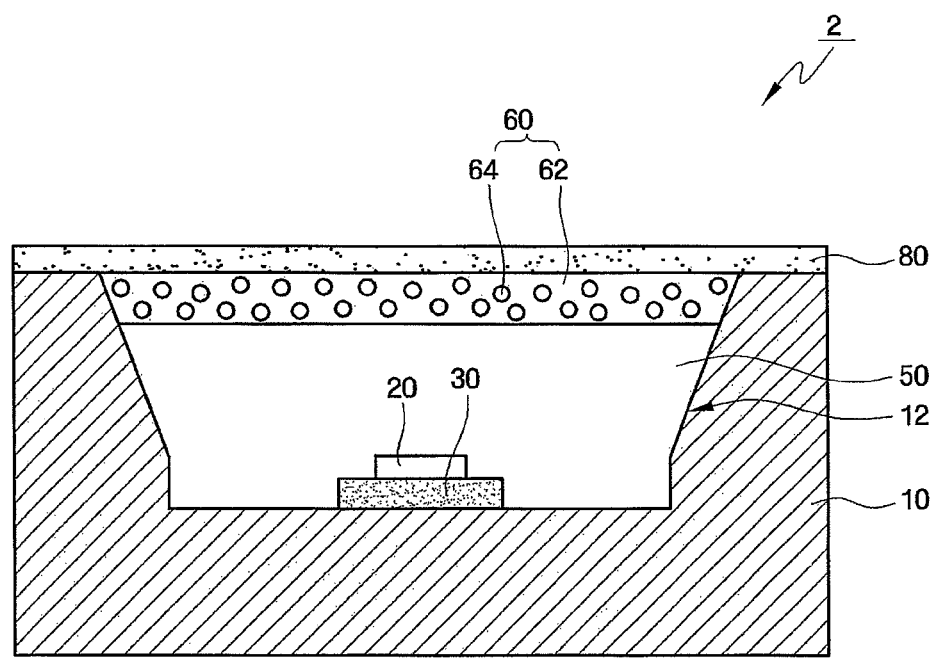
FIG. 4 is a cross-sectional view of a light emitting device according to a second embodiment of the present invention.

Referring first to FIG. 4, the light emitting device 2 according to the second embodiment is different from the light emitting device 1 according to the first embodiment in that it has a filter 80 formed on a phosphor layer 60. The filter 80 absorbs light of a particular wavelength. For example, the filter 80 can be configured to absorb the light primarily emitted from the LED 20, and to not absorb the light secondarily emitted from the phosphor layer 60. The filter 80 may be formed of a material capable of dispersing heat while absorbing light of a particular wavelength. Usable examples of the filter 80 include an inorganic dye or an organic dye.

In particular, when the LED 20 is a UV emitter, a UV filter can be used as the filter 80 since excessive UV light may be harmful to human body.

Figure 5:
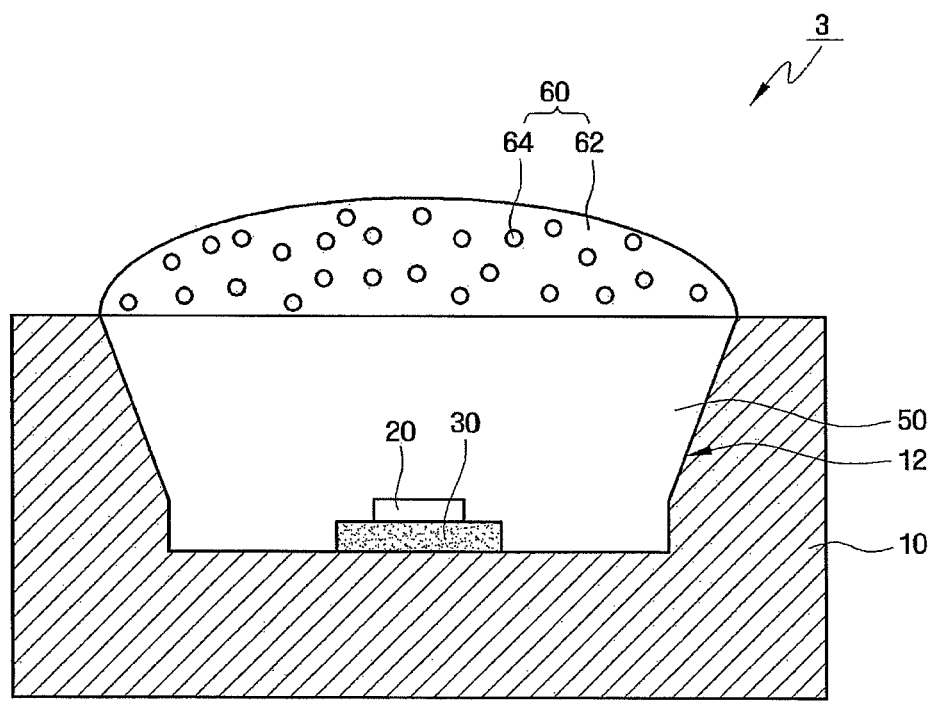
FIG. 5 is a cross-sectional view of a light emitting device according to a third embodiment of the present invention.

Referring to FIG. 5, the light emitting device 3 according to the third embodiment is different from the light emitting device 1 according to the first embodiment in that it has a phosphor layer 60 shaped of a lens. In order to improve light diffusion/extraction characteristics of the LED 20, the phosphor layer 60 may have a predetermined curvature. While FIG. 5 shows that the phosphor layer 60 has a shape of a convex lens, it may have a shape of a concave lens.

Figure 6A:
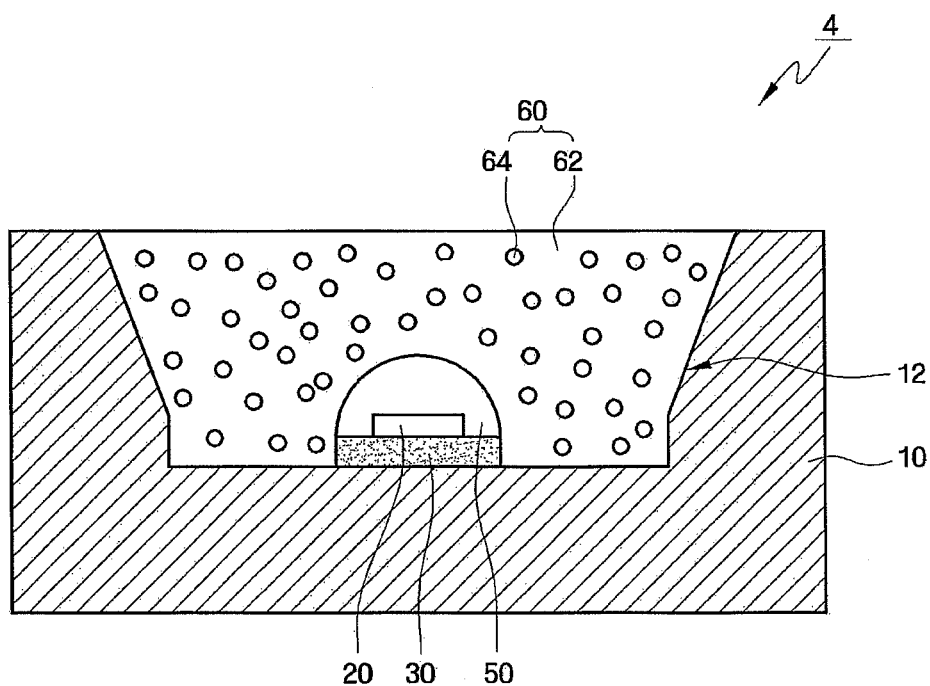
FIG. 6A is a cross-sectional view of a light emitting device according to a fourth embodiment of the present invention.

Referring to FIG. 6A, the light emitting device 4 according to the fourth embodiment is different from the light emitting device 1 according to the first embodiment in that it has a transparent resin layer 50 formed only on the LED 20 and the submount 30 and the phosphor layer 60 and the phosphor material 64 contained therein is dispersed throughout the transparent resin layer 50 to fill a slot 12.

Figure 6B:
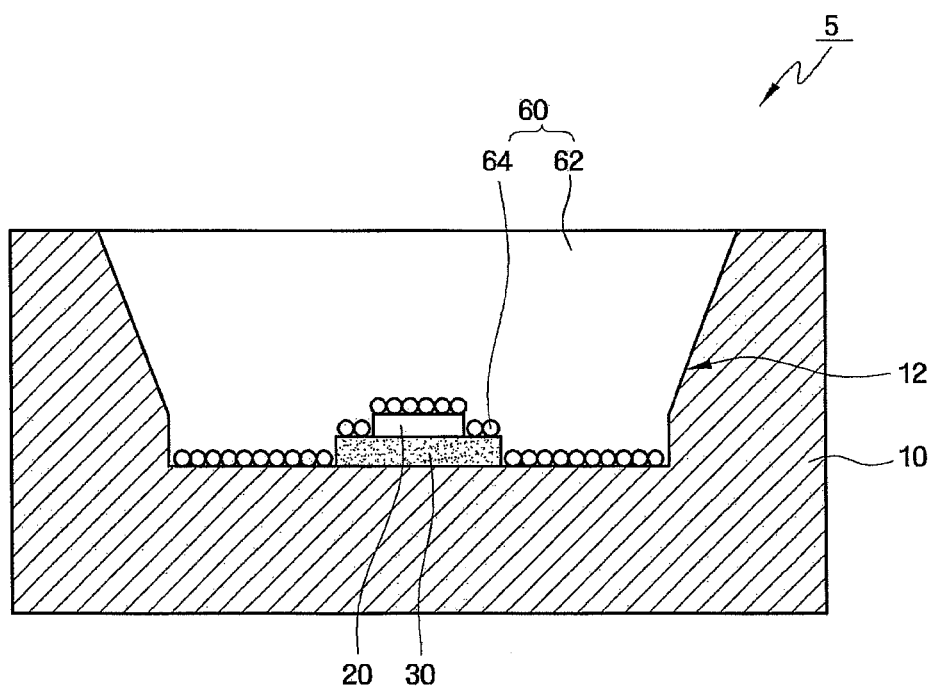
FIG. 6B is a cross-sectional view of a light emitting device according to a fifth embodiment of the present invention.

Referring to FIG. 6B, the light emitting device 5 according to the fifth embodiment is different from the light emitting device 1 according to the first embodiment in that it has a phosphor 64 that is conformally formed on the LED 20 and the submount 30. A transparent resin 62 is formed on the conformal phosphor layer 64.

Hereinafter, light emitting systems manufactured using the above-described light emitting devices 1 through 4 will be described. For brevity of explanation, embodiments will be described with regard to a light emitting system using the light emitting device 1 according to the first embodiment of the present invention by way of example, but the invention is not limited thereto. Rather, it will be apparent to those skilled in the art that the light emitting system can optionally be implemented using the light emitting devices of the second through fifth embodiments described above, and other configurations.

Figure 8:
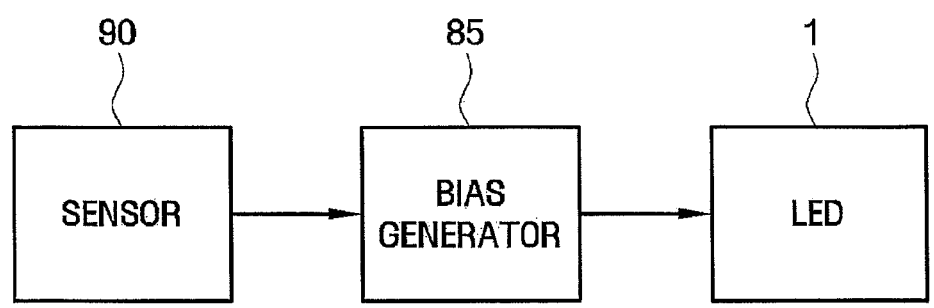
FIG. 8 is a diagram illustrating a light emitting system according to a first embodiment of the present invention.

FIG. 8 is a diagram illustrating a light emitting system according to a first embodiment.

Referring to FIG. 8, the light emitting system according to the first embodiment includes an LED 1, a bias generator 85, and a sensor 90.

In detail, the LED 1 receives a driving bias from the bias generator 85 and generates white light. The bias generator 85 receives a control signal from the sensor 90 and controls the level of the driving bias.

In particular, if the level of the driving bias is adjusted by the sensor 90, the color temperatures of white light can be adjusted in tune with the user's emotion. For example, if the sensor 90 senses the user's body temperature, that is, if the sensed user's body temperature is relatively low, the LED 1 emits reddish white light of a warm color temperature, while if the sensed user's body temperature is relatively high, the LED 1 emits bluish white light of a cold color temperature.

The sensor 90 may be installed on a door handle or door lock to allow the user's body temperature to be easily sensed. For example, the sensor 90 can sense the user's body temperature using infrared rays. Although in the embodiment described above the color temperatures of white light can be adjusted according to the user's body temperature, embodiments of the present invention are not limited thereby, and other forms of external stimulus can optionally be used to drive the bias generator 85.

Figure 9:
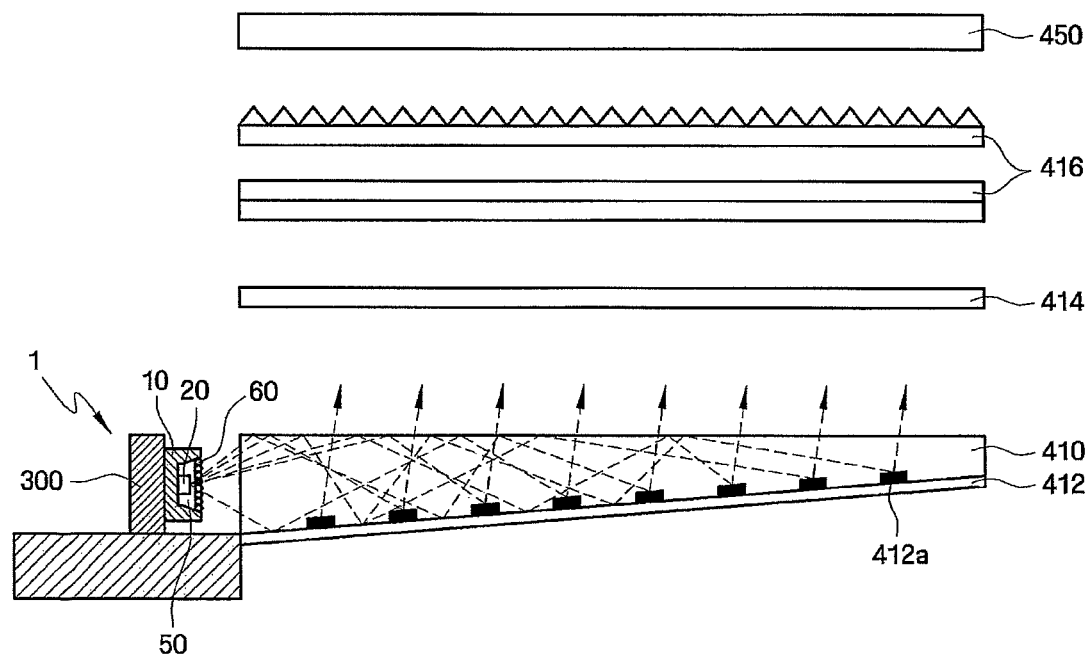
FIG. 9 is a diagram illustrating a light emitting system according to a second embodiment of the present invention.

FIG. 9 is a diagram illustrating a light emitting system according to a second embodiment of the present invention.

Referring to FIG. 9, the light emitting system is an exemplary system, e.g., an end product, to which the light emitting device 1 according to the first embodiment is incorporated. The light emitting system can be applied to a variety of devices, including an illumination device, a display device, a mobile device (e.g., a mobile phone, an MP3 player, a navigation device, etc.), and so on. The light emitting system illustrated in FIG. 9 is an edge type backlight unit (BLU) used for a liquid crystal display (LCD). Since the LCD is not a self-emitting device, a BLU, which is usually provided in rear of an LCD panel, is used as a light source.

Referring to FIG. 9, the BLU includes a light emitting device 1, a light guiding plate 410, a reflection plate 412, a diffusion sheet 414, and a pair of prism sheets 416.

The light emitting device 1 provides light. Here, the light emitting device 1 may be of a side view type. As described above, the light emitting device 1 may be varied color temperatures of white light by adjusting the level of a driving bias. That is, the color temperatures of white light emitted from the light emitting device 1 used for a BLU are varied, thereby creating image displays shown on an LCD panel 450 or producing user's desired images.

The light guiding plate 410 serves to guide the light supplied to the LCD panel 450. The light guiding plate 410 may be formed of a plastic-based transparent panel such as acryl, and allows the light generated from the light emitting device 1 to travel toward to the LCD panel 450 disposed over the light guiding plate 410. Various patterns 412a for changing the traveling direction of the light incident into the light guiding plate 410 to the LCD 450 can be printed on the rear of the light guiding plate 410.

The reflection plate 412 is provided on the rear surface of the light guiding plate 410 and allows the light emitted in a downward direction to supply the light to the light guiding plate 410. The reflection plate 412 reflects the light that is not reflected by the patterns 412 formed on the rear surface of the light guiding plate 410 toward an exit face of the light guiding plate 410, thereby reducing loss of light incident into the LCD panel 450 and enhancing uniformity of light transmitted to the exit face of the light guiding plate 410.

The diffusion sheet 414 diffuses incident light from the light guiding plate 410, thereby effectively preventing partial congestion of light.

The prism sheets 416 may include triangular prism patterns formed on each surface in a predetermined arrangement. In an exemplary embodiment, the prism sheets may include two sheets including prisms alternately arranged at a predetermined angle to focus light diffused by the diffusion sheet 414 in a direction perpendicular to the LCD panel 450.

FIGS. 10 through 13 are diagrams illustrating light emitting systems according to third through sixth embodiments of the present invention.

Figure 10:
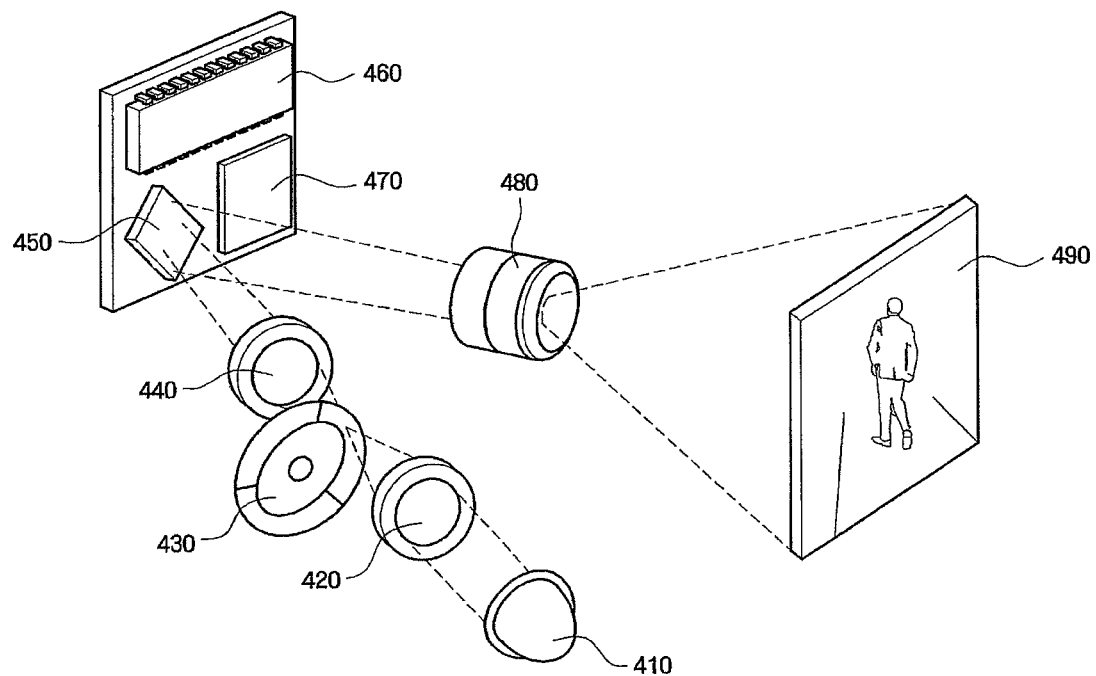
FIGS. 10 through 13 are diagrams illustrating light emitting systems according to third through sixth embodiments of the present invention.
Figure 11:
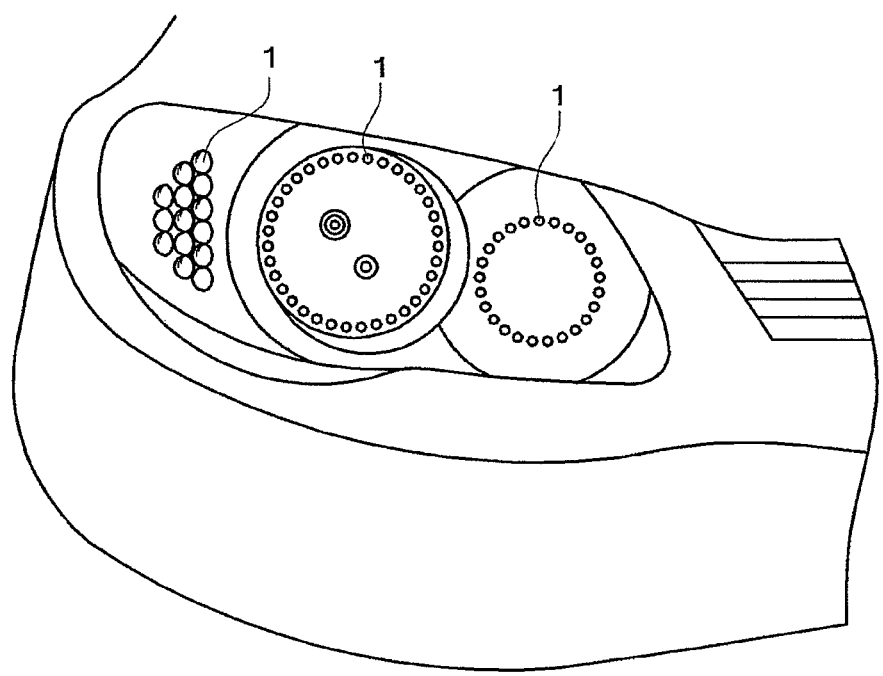
Figure 12:
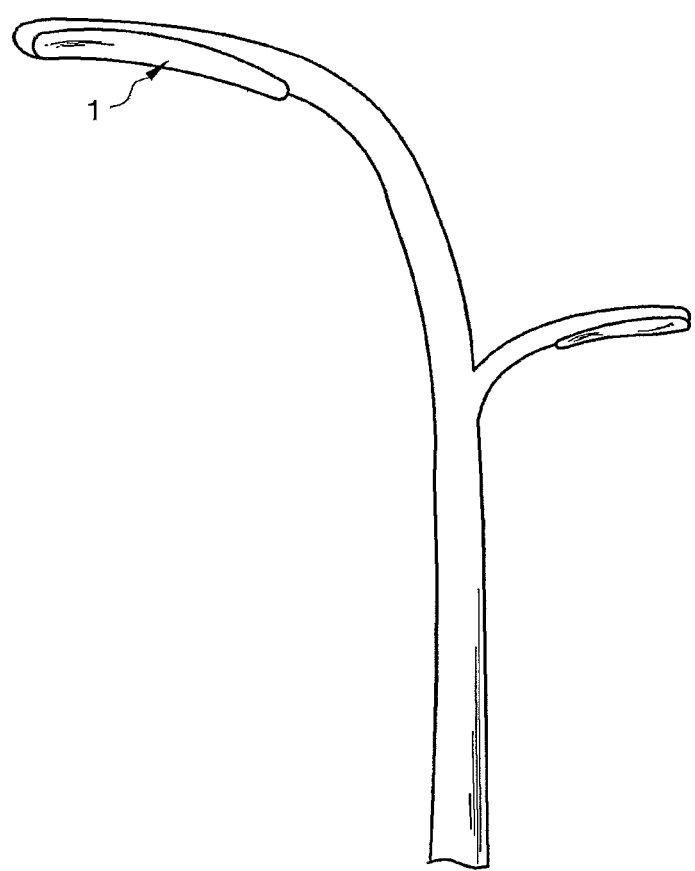
Figure 13:
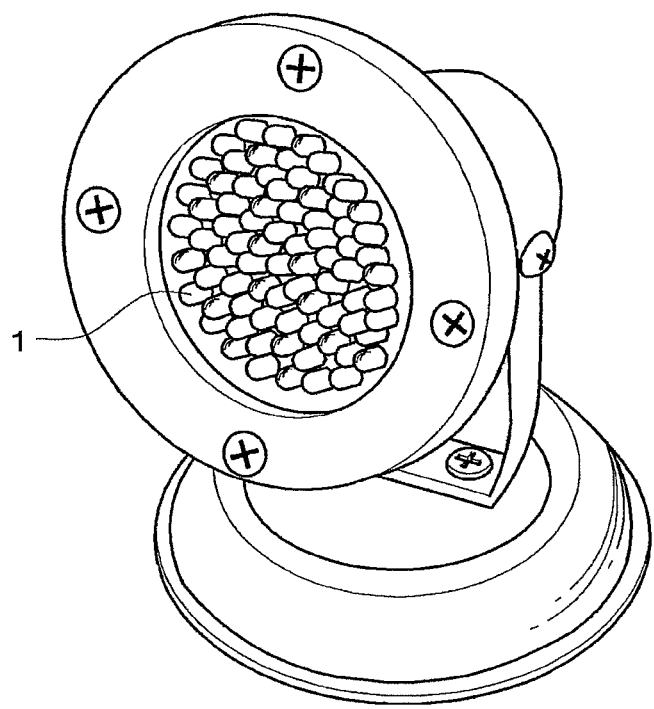

In detail, FIG. 10 illustrates a projector, FIG. 11 illustrates a headlight of an automobile, FIG. 12 illustrates a street lamp, and FIG. 13 illustrates an illumination lamp. The light emitting device 1 used in FIGS. 10 through 13 may be of a top view type.

Referring to FIG. 10, the light emitted from a light source 410 passes through a condensing lens 420, a color filter 430, and a sharping lens 440, and is reflected at a digital micromirror device (DMD) 450. Then, the reflected light passes through a projection lens 480 to then reach a screen 490. The light emitting device configured in accordance with embodiments of the present invention may be incorporated in the light source 410.

As in the projector shown in FIG. 10, in the automobile's headlight shown in FIG. 11, the street lamp shown in FIG. 12, and the illumination lamp shown in FIG. 13, the color temperatures of white light emitted from the light emitting device

What is claimed is:

1. A light emitting device comprising:
   a light emitting element which is operated by a forward driving bias to emit first light and includes a first conductive layer of a first conductivity type, a second conductive layer of a second conductivity type, a light emitting layer disposed between the first conductive layer and the second conductive layer, a first electrode connected to the first conductive layer, and a second electrode connected to the second conductive layer, wherein the first conductive layer, the second conductive layer and the light emitting layer are represented by $In_xAl_yGa_{(1-x-y)}N$ ($0 \leq x \leq 1$, $0 \leq y \leq 1$); and
   a phosphor layer including a phosphor which partially wavelength-converts the first light to emit second light, wherein the phosphor layer includes only the phosphor or a combination of transparent resin and a phosphor,
   wherein the light emitting element emits blue light, the phosphor layer includes a yellow phosphor which partially wavelength-converts the blue light to emit yellow light and a red phosphor which partially wavelength-converts the blue light to emit red light, or a green phosphor which partially wavelength-converts the blue light to emit green light and a red phosphor which partially wavelength-converts the blue light to emit red light, and
   wherein the light emitting device emits white light using the first light and the second light such that a color temperature of the white light is varied by adjusting a level of the driving bias.

2. The light emitting device of claim 1, wherein the phosphor is at least one selected from the group consisting of a nitride-/oxynitride-based phosphor, mainly activated by lanthanoids such as Eu and Ce; an alkaline earth halogen apatite phosphor, mainly activated by lanthanoids such as Eu or by transition metal elements such as Mn; an alkaline earth metal borate halogen phosphor; an alkaline earth metal aluminate phosphor; an alkaline earth sulfide phosphor; a rare earth aluminate phosphor, mainly activated by lanthanoids such as Ce; an alkaline earth silicate phosphor; an alkaline earth thiogallate phosphor; an alkaline earth silicon nitride phosphor; a germinate phosphor; a rare earth silicate phosphor; and an organic and an organic complexes, mainly activated by lanthanoids such as Eu.

3. The light emitting device of claim 1, wherein the phosphor is at least one selected from the group consisting of $M_2Si_5N_8$:Eu, $MSi_7N_{10}$:Eu, $M_{1.8}Si_5O_{0.2}N_8$:Eu, $M_{0.9}Si_7O_{0.1}N_{10}$:Eu (M represents at least one element selected from among Sr, Ca, Ba, Mg and Zn), $MSi_2O_2N_2$:Eu, $M_5(PO_4)_3$ X:R(X represents at least one element selected from among F, Cl, Br, and I, and R represents at least one element selected from among Eu and Mn), $M_2B_5O_9X$:R, $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R, $La_2O_2S$:Eu, $Y_2O_2S$:Eu, $Gd_2O_2S$:Eu, YAG-based phosphors represented by $Y_3Al_5O_{12}$:Ce, $(Y_{0.8}Gd_{0.2})_3Al_5O_{12}$: Ce, $Y_3(Al_{0.8}Ga_{0.2})_5 O_{12}$: Ce, and $(Y, Gd)_3 (Al, Ga)_5 O_{12}$, $Tb_3Al_5O_{12}$:Ce, $Lu_3Al_5O_{12}$: Ce in which portion or all of Y is substituted with Tb or Lu, alkaline earth silicate phosphor, $(SrBa)_2SiO_4$:Eu, ZnS:Eu, and $Zn_2GeO_4$: Mn, $MGa_2S_4$:Eu (if necessary, the phosphor can contain at least one element selected from among Tb, Cu, Ag, Au, Cr, Nd, Dy, Co, Ni and Ti, in place of Eu, or in addition to Eu).

4. The light emitting device of claim 1, wherein the light emitting device is a package disposed within a slot of a package body, wherein the slot is larger than the light emitting element, and the light emitting element is placed in the middle of the slot, and
   wherein the package body is at least one selected from the group consisting of an organic material having high light transmittance such as silicon resin, epoxy resin, acryl resin, glass resin, fluorine resin and imide resin, an inorganic material such as glass and silica gel, a variety of fillers including aluminum nitride, aluminum oxide, and composite materials thereof, and a metallic or ceramic material.

5. The light emitting device of claim 4, further comprising a transparent resin layer in the slot of the package body, wherein the transparent resin layer fills approximately 90% of the slot.

6. The light emitting device of claim 5, wherein the transparent resin layer is formed of a material, filling the slot of the package body, which is at least one selected from the group consisting of epoxy resin, silicon resin, hardened silicon resin, denatured silicon resin, urethane resin, ocetane resin, acryl resin, polycarbonate resin and polyimide resin.

7. The light emitting device of claim 1, wherein the driving bias is DC power.

8. A light emitting system comprising:
   the light emitting device described in claim 1; and
   a sensor which senses a user's body temperature,
   wherein the level of the driving bias is controlled by the sensor.

9. A light emitting system comprising the light emitting device described in claim 1.

* * * * *